United States Patent
Lai et al.

(10) Patent No.: US 10,368,116 B2
(45) Date of Patent: Jul. 30, 2019

(54) ROLL-OFF PARAMETER DETERMINING METHOD AND MODULE

(71) Applicant: MStar Semiconductor, Inc., Hsinchu Hsien (TW)

(72) Inventors: Szu-Hsiang Lai, Hsinchu Hsien (TW); Yu-Shen Chou, Hsinchu Hsien (TW); Kai-Wen Cheng, Hsinchu Hsien (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 0 days.

(21) Appl. No.: 15/890,643

(22) Filed: Feb. 7, 2018

(65) Prior Publication Data

US 2019/0052920 A1 Feb. 14, 2019

(30) Foreign Application Priority Data

Aug. 9, 2017 (TW) .............................. 106126899 A

(51) Int. Cl.

| H04N 7/173 | (2011.01) |
|---|---|
| H04N 21/266 | (2011.01) |
| H04N 21/2383 | (2011.01) |
| H04N 21/61 | (2011.01) |
| H03K 19/20 | (2006.01) |

(52) U.S. Cl.
CPC ....... *H04N 21/266* (2013.01); *H04N 21/2383* (2013.01); *H04N 21/6112* (2013.01); *H03K 19/20* (2013.01)

(58) Field of Classification Search
None
See application file for complete search history.

(56) References Cited

U.S. PATENT DOCUMENTS

2018/0076991 A1* 3/2018 Lee ..................... H04L 27/2334

FOREIGN PATENT DOCUMENTS

CN 105993180 A 10/2016

OTHER PUBLICATIONS

Digital Video Broadcasting (DVB). "DVB Document A171-2"; Mar. 2015. [Retrieved Sep. 24, 2018]. Retrieved from Internet <https://www.dvb.org/resources/public/standards/A171-2%20S2X%20imp.pdf> (Year: 2015).*
TW Office Action, dated Oct. 9, 2018, 6 pages.

* cited by examiner

*Primary Examiner* — William J Kim
(74) *Attorney, Agent, or Firm* — McClure, Qualey & Rodack, LLP

(57) ABSTRACT

A roll-off parameter determining module disposed at a receiving terminal is provided. The receiving terminal receives first roll-off information of a first frame and second roll-off information of a second frame. The first frame is adjacent to the second frame. The module for determining a roll-off parameter includes: a register unit; a first determining unit, determining whether one of the first roll-off information and the second roll-off information includes a first data type, and generating a first roll-off parameter indicator; a second determining unit, determining whether one of the first roll-off information and the second roll-off information includes a second data type and outputting a second roll-off parameter indicator; and a look-up table (LUT) unit, looking up an LUT according to the first roll-off parameter indicator and a second roll-off parameter indicator to output a roll-off parameter.

15 Claims, 5 Drawing Sheets

ROLL-OFF PARAMETER DETERMINING METHOD AND MODULE

This application claims the benefit of Taiwan application Serial No. 106126899, filed Aug. 9, 2017, the subject matter of which is incorporated herein by reference.

BACKGROUND OF THE INVENTION

Field of the Invention

The invention relates in general to a roll-off parameter determining method and module, and more particularly, to a roll-off parameter determining method and module capable of retrieving a roll-off parameter.

Description of the Related Art

The signal-to-noise ratio (SNR) is a critical indicator for measuring the performance of a communication system. To maximize the SNR of a system, a pulse shaping filter (PSF) may be used at a transmitting terminal of a communication system to form transmitting signals, and a match filter (MF) matching the PSF may be used at a receiving terminal to receive the signals. The PSF/MF may be a raised cosine filter or a root raised cosine filter, which are both associated with a roll-off parameter.

In the Digital Video Broadcasting-Satellite Second Generation (DVB-S2) standard, a transmitting terminal can transmit control information associated with a roll-off parameter, i.e., roll-off information, in a baseband header (BBHEADER) in a baseband frame (BBFRAME). In the DVB-S2 standard, the roll-off information includes two bits—00, 10 and 10 representing 0.35, 0.25 and 0.2, respectively.

In the new-generation DVB-S2X standard, a transmitting terminal can transmit alternating roll-off information, which represents a smaller roll-off parameter. Roll-off information 00, 01, 10 and 11 in alternation represent 0.15, 0.10 and 0.05, respectively. However, methods in current technologies for retrieving roll-off information are incapable of retrieving alternating roll-off information in the DVB-S2X standard.

SUMMARY OF THE INVENTION

Therefore, a primary object of the present invention is to provide a roll-off information determining method and module capable of retrieving alternating roll-off information in the DVB-S2X standard.

The present invention discloses a roll-off parameter determining module disposed at a receiving terminal. The receiving end includes an analyzing module, which analyzes a first frame and a second frame to identify first roll-off information in the first frame and second roll-off information in the second frame. The first frame is adjacent to the second frame. The roll-off parameter determining module includes: a register unit, storing the first roll-off information; a first determining unit, determining whether one of the first roll-off information and the second roll-off information includes a first data type according to the first-roll off information received from the register unit and the second roll-off information received from the analyzing module to generate a first roll-off parameter indicator; a second determining unit, determining whether at least one of the first roll-off information and the second roll-off information includes a second data type according to the first-roll off information received from the register unit and the second roll-off information received from the analyzing module to generate a second roll-off parameter indicator; and a look-up table (LUT) unit, looking up an LUT according to the first roll-off parameter indicator and the second roll-off parameter indicator to output a roll-off parameter.

The present invention further discloses a parameter determining method applied to a receiving terminal of a communication system. The receiving terminal includes an analyzing module, which analyzes a first frame and a second frame to identify first roll-off information in the first frame and second roll-off information in the second frame. The first frame is adjacent to the second frame. The parameter determining method includes: storing the first roll-off information in a register unit; receiving the first roll-off information from the register unit and receiving the second roll-off information from the analyzing module, and determining whether one of the first roll-off information and the second roll-off information includes a first data type according to the first roll-off information received from the register unit and the second roll-off information received from the analyzing module to generate a first roll-off parameter indicator; determining whether at least one of the first roll-off information and the second roll-off information includes a second data type according to the first roll-off information received from the register unit and the second roll-off information received from the analyzing module to generate a second roll-off parameter indicator; and looking up an LUT according to the first roll-off parameter indicator and the second roll-off parameter indicator to output a roll-off parameter.

The above and other aspects of the invention will become better understood with regard to the following detailed description of the embodiments. The following description is made with reference to the accompanying drawings.

DETAILED DESCRIPTION OF THE INVENTION

Figure 1:
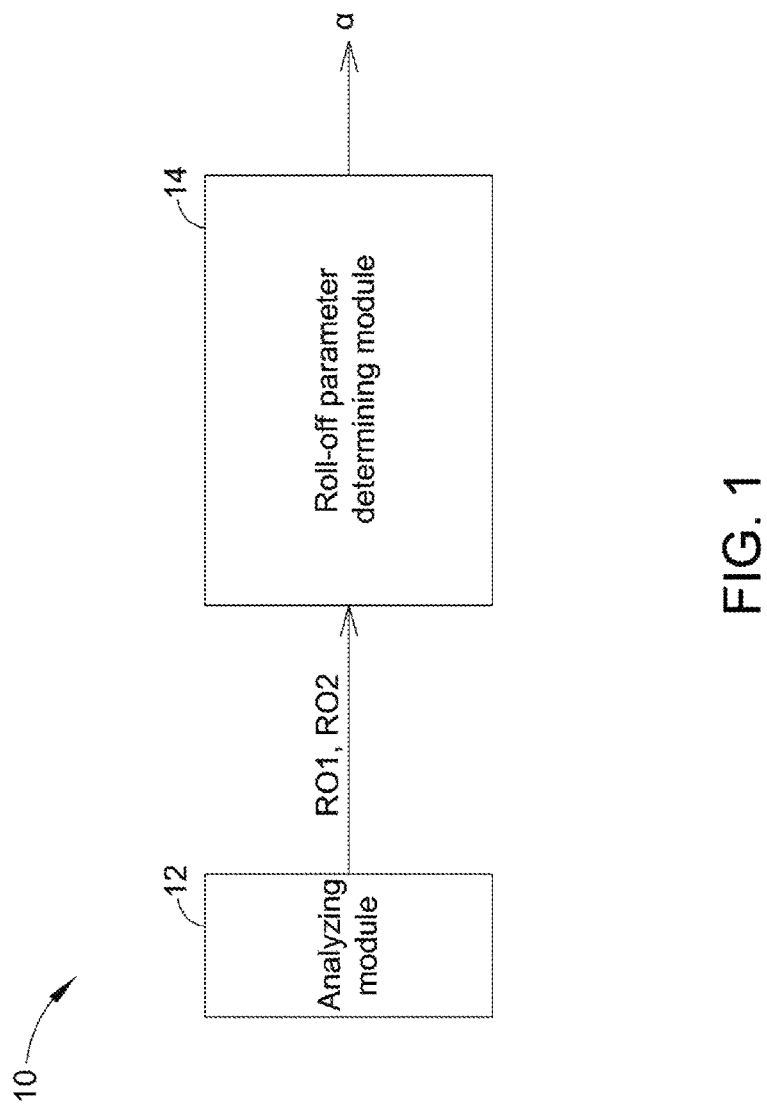
FIG. 1 is a block diagram of a receiving terminal according to an embodiment of the present invention.

FIG. 1 shows a block diagram of a receiving terminal 10 according to an embodiment of the present invention. Referring to FIG. 1, the receiving terminal 10 is compliant with, for example, the DVB-S2 or DVB-S2X standard, and is, for example, a television, a television box/set-up box (STB), or a television stick. The receiving terminal 10 includes an analyzing module 12 and a roll-off parameter determining module 14.

Figure 5:
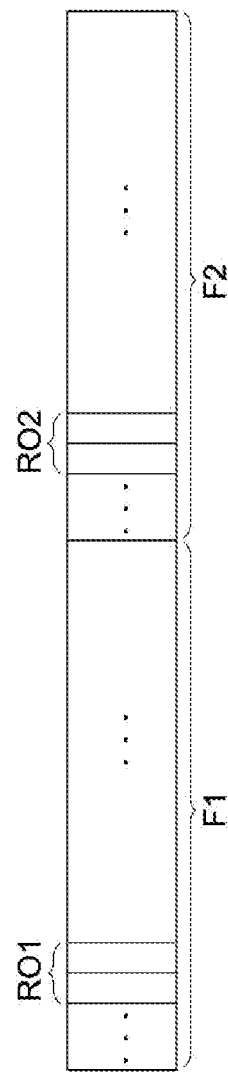
FIG. 5 is a schematic diagram of two adjacent frames according to an embodiment of the present invention.

The analyzing module 12 analyzes a frame F1 to identify roll-off information RO1 in the frame F1, and analyzes a frame F2 to identify roll-off information RO2 in the frame F2. The roll-off information RO1 and RO2 is control information associated with roll-off parameters in the frames F1 and F2. The frames F1 and F2 are two temporally adjacent frames, i.e., the frame F1 is subsequent to the frame F2 (as shown in FIG. 5). The roll-off information RO1 and RO2 may be located in frame headers of the frames F1 and F2. Further, the roll-off information RO1 and RO2 may be located in a RO field in frame headers of the frames F1 and F2.

It should be noted that, the analyzing module 12 may be implemented by software and/or hardware. Various implementation details are generally known to one person skilled in the art, and shall be omitted herein.

Figure 2:
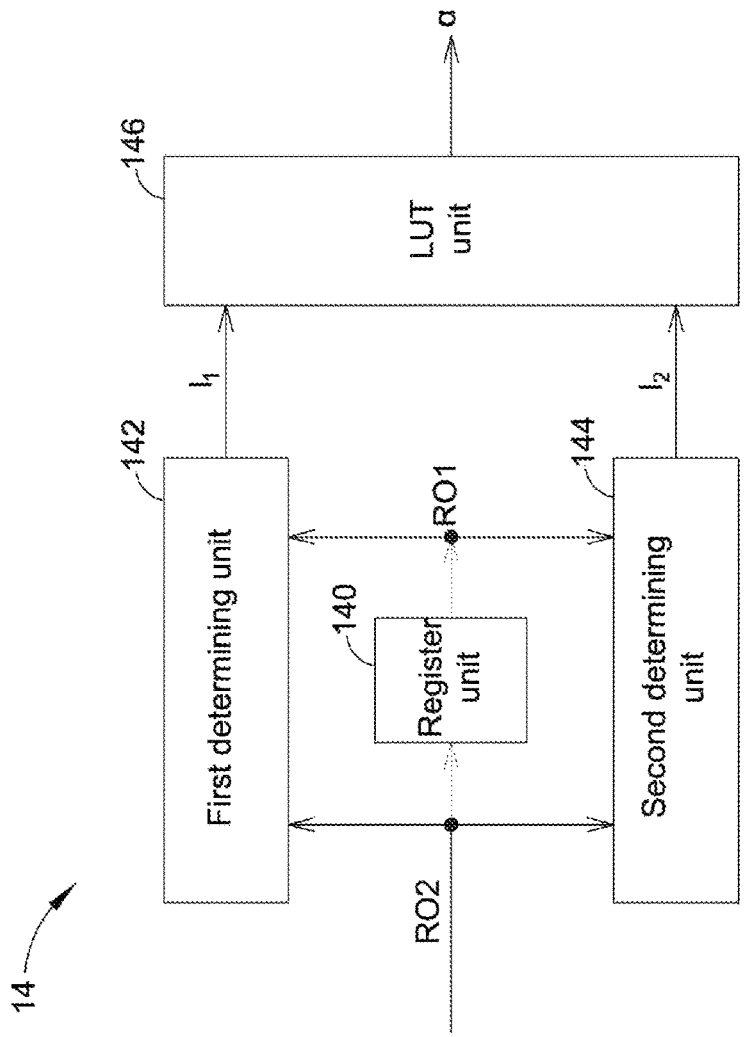
FIG. 2 is a block diagram of a roll-off parameter determining module according to an embodiment of the present invention.
Figure 3:
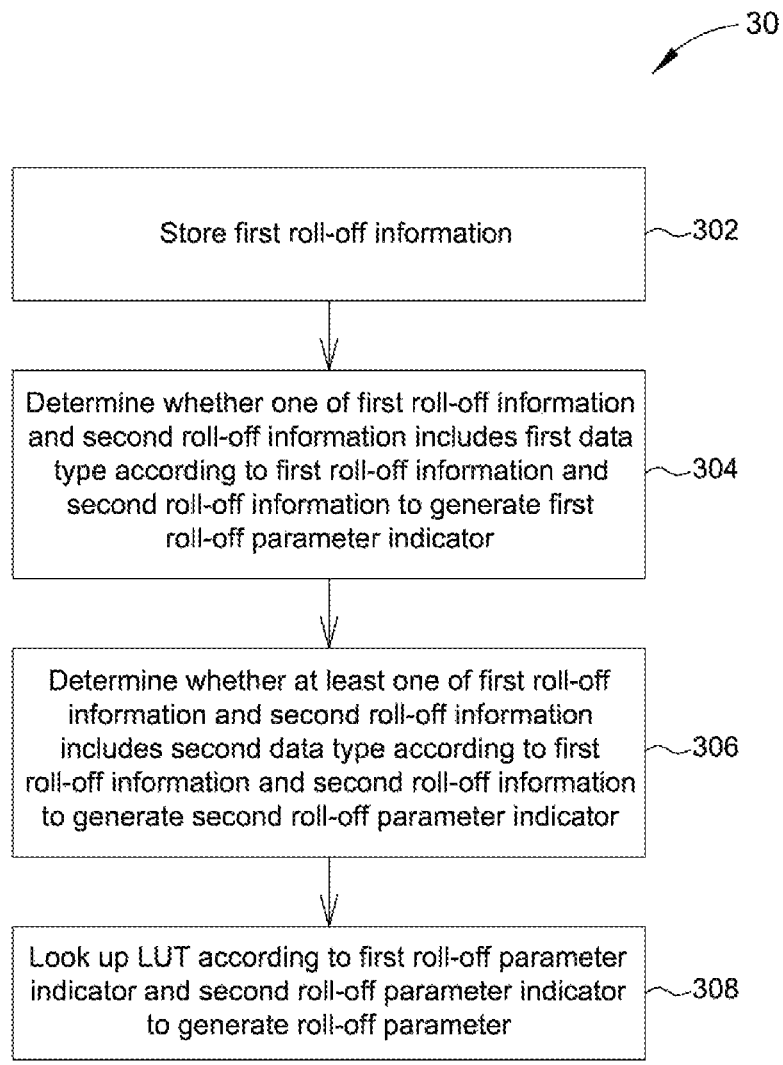
FIG. 3 is a flowchart of a roll-off parameter determining method according to an embodiment of the present invention.

The roll-off parameter determining module 14 outputs a roll-off parameter α according to the roll-off information RO1 and the roll-off information RO2. FIG. 2 shows a block diagram of the roll-off parameter determining module 14 according to an embodiment of the present invention. FIG. 3 shows a flowchart of a roll-off parameter determining method according to an embodiment of the present invention. The roll-off parameter determining module 14 includes a register unit 140, a first determining unit 142, a second determining unit 144 and a look-up table (LUT) unit 146.

The register unit 140 stores the roll-off information RO1 (step 302). In one embodiment, the roll-off information RO1/RO2 is formed by two bits. For illustration purposes, the two bits of the roll-off information RO1 are represented as $r_{1,i-1}$ and $r_{2,i-1}$, and the two bits of the roll-off information RO2 are represented as $r_{1,i}$ and $r_{2,i}$, where i represents a time index. The register unit 140 may first receive the two bits $r_{1,i-1}$ and $r_{2,i-1}$ of the roll-off information RO1 from the analyzing module 12, and store the two bits $r_{1,i-1}$ and $r_{2,i-1}$ of the roll-off information RO1 for a frame interval before outputting the two bits $r_{1,i-1}$ and $r_{2,i-1}$ of the roll-off information RO1. As such, the first determining unit 142 and the second determining unit 144 can perform determination according to the roll-off information RO1 and RO2 of the two temporally adjacent frames F1 and F2.

The first determining unit 142 determines whether one of the roll-off information RO1 and the roll-off information RO2 includes a first data type according to the roll-off information RO1 and the roll-off information RO2, and accordingly generates a roll-off parameter indicator $I_1$ (step 304). In one embodiment, the first data type may be "logic 11" (i.e., "Boolean 11"). In one embodiment, the roll-off parameter indicator $I_1$ may be a binary value. For example, when the roll-off parameter $I_1=1$, it means that one of the roll-off information RO1 and RO2 includes "logic 11", e.g., the roll-off information (RO1, RO2) is (11, 00), (11, 01), (11, 10), (00, 11), (01, 11) or (10, 11). When the roll-off parameter $I_1=0$, it means that neither of the roll-off information RO1 and RO2 includes "logic 11", e.g., the roll-off information (RO1, RO2) is (00, 00), (01, 01) or (10, 10). For illustration purposes, the roll-off information (RO1, RO2) represent a tuple formed by the roll-off information. For example, when the roll-off information (RO1, RO2) is (11, 01), it means that the roll-off information RO1 is "logic 11" and the roll-off information RO2 is "logic 01".

The second determining unit 142 determines whether at least one of the roll-off information RO1 and the roll-off information RO2 includes a second data type according to the roll-off information RO1 and the roll-off information RO2, and accordingly generates a roll-off parameter indicator 12 (step 306). In one embodiment, the second data type may be one of "logic 00", "logic 01", and "logic 10" (i.e., "Boolean 00", "Boolean 01" and "Boolean 10"). In one embodiment, the roll-off parameter indicator 12 may include two bits. For example, when the roll-off parameter $I_2=00$, it means that at least one of the roll-off information (RO1 and RO2) includes "logic 00", e.g. the roll-off information (RO1, RO2) is (11, 00), (00, 11), or (00, 00). When the roll-off parameter $I_2=01$, it means that at least one of the roll-off information (RO1 and RO2) includes "logic 01", e.g. the roll-off information (RO1, RO2) is (11, 01), (01, 11), or (01, 01). When the roll-off parameter $I_2=10$, it means that at least one of the roll-off information (RO1 and RO2) includes "logic 10", e.g. the roll-off information (RO1, RO2) is (11, 10), (10, 11), or (10, 10).

The LUT unit 146 looks up an LUT according to the roll-off parameter indicators $I_1$ and $I_2$ to output the roll-off parameter α (step 308). In one embodiment, the LUT unit 146 may store corresponding relationships in Table-I below. For example, when the roll-off information (RO1, RO2) is (00, 00), the roll-off parameter indicators ($I_1$, $I_2$) are respectively (0, 00), and the LUT unit 146 accordingly outputs the roll-off parameter α=0.35. For another example, when the roll-off information (RO1, RO2) is (11, 00) or (00, 11), the roll-off parameter indicators ($I_1$, $I_2$) are respectively (1, 00), and the LUT unit 146 accordingly outputs the roll-off parameter α=0.15.

TABLE 1

| ($I_1$, $I_2$) | α |
|---|---|
| (0, 00) | 0.35 |
| (0, 01) | 0.25 |
| (0, 10) | 0.20 |
| (1, 00) | 0.15 |
| (1, 01) | 0.10 |
| (1, 10) | 0.05 |

It should be noted that, the LUT unit 146 may be implemented by software and/or hardware. Various implementation details of the LUT unit 146 are generally known to one person skilled in the art, and shall be omitted herein.

Figure 4:
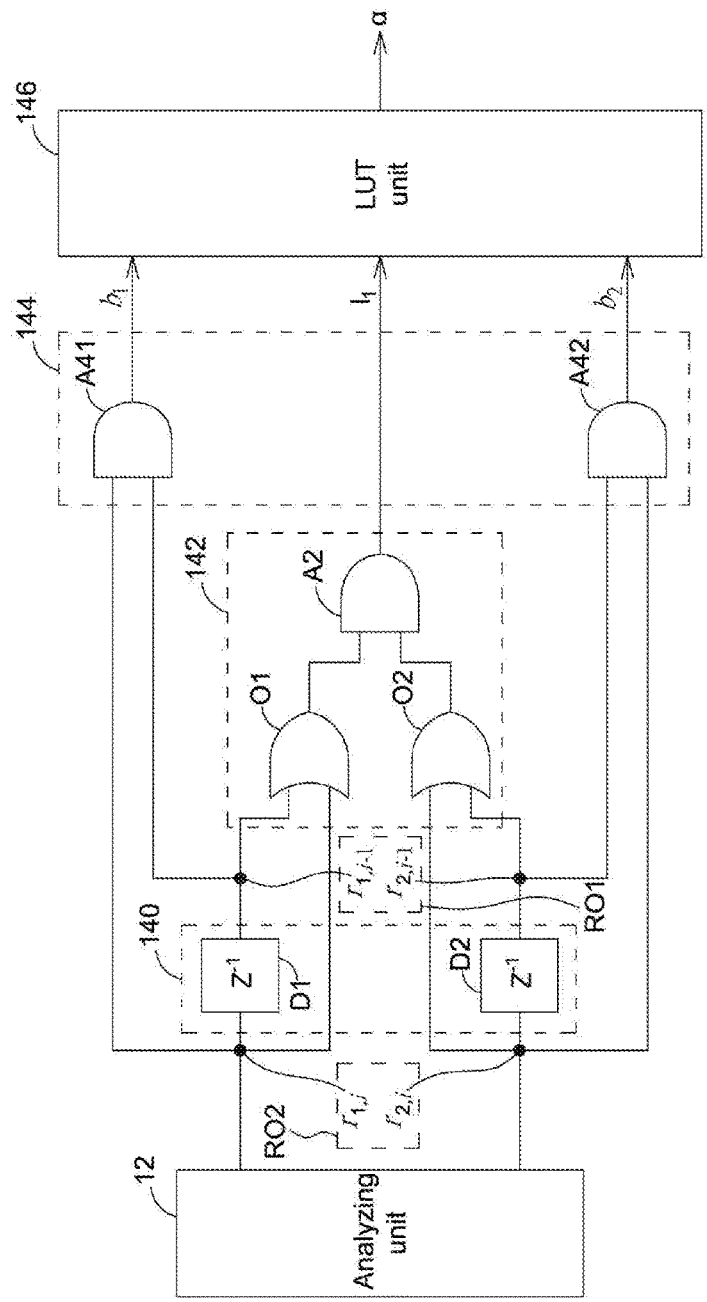
FIG. 4 is a block diagram of a roll-off parameter determining module according to an embodiment of the present invention.

FIG. 4 shows a block diagram of the register unit 140, the first determining unit 142 and the second determining unit 144 according to an embodiment of the present invention. Referring to FIG. 4, the register unit 140 includes registers D1 and D2. For example, the registers D1 and D2 may respectively store the bits $r_{1,i-1}$ and $r_{2,i-1}$ of the roll-off information RO1. Further, each of the registers D1 and D2 has an input end and an output end. The output ends of the registers D1 and D2 are for outputting the bits $r_{1,i-1}$ and $r_{2,i-1}$ stored in the registers D1 and D2, and are coupled to the analyzing module 12 to receive the bits $r_{1,i}$ and $r_{2,i}$ of the roll-off information RO2.

The first determining unit 142 includes an AND gate A2 and OR gates O1 and O2. The OR gates O1 and O2 have their first input ends respectively coupled to the input ends of the register D1 and the register D2 (i.e., coupled to the analyzing module 12), and their second input ends respectively coupled to the output ends of the register D1 and the register D2. The AND gate A2 has its first input end and its second input end respectively coupled to the output ends of the OR gates OR1 and OR2. The OR gate OR1 performs an OR operation on the bit $r_{1,i-1}$ of the roll-off information RO1 and the bit $r_{1,i}$ of the roll-off information RO2, and generates an OR result ($r_{1,i-1}|r_{1,i}$); the OR gate OR2 performs an OR operation on the bit $r_{2,i-1}$ of the roll-off information RO1 and the bit $r_{2,i}$ of the roll-off information RO2, and generates an OR result ($r_{2,i-1}|r_{2,i}$). The AND gate A2 performs an AND operation on the OR result ($r_{1,i-1}|r_{1,i}$) and the OR result ($r_{2,i-1}|r_{2,i}$) to generate an AND result d; i.e., ($r_{1,i-1}|r_{1,i}$) & ($r_{2,i-1}|r_{2,i}$). In this situation, when the roll-off parameter indicator $I_1$ is logic 1, it means that at least one of the roll-off information RO1 and the roll-off information RO2 is "11"; when the roll-off parameter indicator $I_1$ is logic 0, it means that neither of the roll-off information RO1 and the roll-off information RO2 is "11".

The second determining unit 144 includes an AND gate A41 and an AND gate A42. The AND gate A41 and the AND gate A42 have their first input ends respectively coupled to the input ends of the register D1 and the register D2 (i.e., coupled to the analyzing module 12), and their second input ends respectively coupled to the output ends of the register D1 and the register D2. The AND gate A41 performs an AND operation on the bit $r_{1,i-1}$ of the roll-off information RO1 and the bit $r_{1,i}$ of the roll-off information RO2, and outputs/generates an output bit $b_1$ as an AND result ($r_{1,i-1}$ & $r_{1,i}$). The AND gate A42 performs an AND operation on the bit $r_{2,i-1}$ of the roll-off information RO1 and the bit $r_{2,i}$ of the roll-off information RO2, and outputs/generates an output bit $b_2$ as an AND result ($r_{2,i-1}$ & $r_{2,i}$).

The LUT unit 146 is coupled to the AND gates A41 and A42 of the second determining unit 144 and the AND gate A2 of the first determining unit 142. Thus, when the roll-off information RO1 is identical to the roll-off information RO2, the roll-off parameter indicator 12 (i.e., $b_1b_2$) is the roll-off information RO1/RO2, when the roll-off information RO1 is different from the roll-off information RO2 and one of the roll-off information RO1 and the roll-off information RO2 is "11", the roll-off parameter indicator $I_2$ (i.e., $b_1b_2$) is the other of the roll-off information RO1/RO2 that is not "11".

It should be noted that, the roll-off parameter determining module of the present invention is capable of retrieving the roll-off information in the DVB-S2X standard as well as the roll-off information in the DVB-S2 standard. Thus, a receiving terminal only needs to be provided with one roll-off parameter determining module of the present invention, and the roll-off information in the DVB-S2 standard and in the DVB-S2X standard can be simultaneously retrieved without involving a conventional roll-off parameter determining module additionally provided for the DVB-S2 standard. In other words, the roll-off parameter determining module of the present invention provides an advantage of backward compatibility.

Further, in the first determining unit 142 and the second determining unit 144, the OR operation and the AND operation both have a commutative property. Thus, in a situation where "the roll-off information RO1 is xx and the roll-off information RO2 is yy" and "the roll-off information RO1 is yy and the roll-off information RO2 is xx", identical roll-off parameter indicators $Ii$ and 12 can be obtained. In other words, given that roll-off information (information at the roll-off fields) of any two adjacent is received, the roll-off parameter determining module 14 is capable of determining the roll-off parameter α, achieving benefits of having a simple circuit structure, low costs and a short response time.

In conclusion, using simple logic operations, the present invention is capable of quickly determining a parameter according to information of two adjacent frame, achieving benefits of having a simple circuit structure, low costs and a short response time as well as achieving backward compatibility.

While the invention has been described by way of example and in terms of the embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A roll-off parameter determining device, disposed at a receiving terminal, the receiving terminal comprising an analyzing module, the analyzing module analyzing a first frame and a second frame to identify first roll-off information in the first frame and second roll-off information in the second frame, the first frame being adjacent to the second frame, the roll-off parameter determining device comprising:
   a register unit, storing the first roll-off information;
   a first determining unit, determining whether one of the first roll-off information and the second roll-off information comprises a first data type according to the first roll-off information received from the register unit and the second roll-off information received from the analyzing module to generate a first roll-off parameter indicator;
   a second determining unit, determining whether at least one of the first roll-off information and the second roll-off information comprises a second data type according to the first roll-off information received from the register unit and the second roll-off information received from the analyzing module to generate a second roll-off parameter indicator; and
   a look-up table (LUT) unit, looking up an LUT according to the first roll-off parameter indicator and the second roll-off parameter indicator to output a roll-off parameter.

2. The roll-off parameter determining device according to claim 1, wherein each of the first roll-off information and the second roll-off information is formed by two bits.

3. The roll-off parameter determining device according to claim 1, wherein the first data type is "logic 11".

4. The roll-off parameter determining device according to claim 1, wherein the second data type is one of "logic 00", "logic 01" and "logic 10".

5. The roll-off parameter determining device according to claim 1, wherein the register unit comprises:
   a first register; and
   a second register;
   wherein, the first register stores a first bit of the first roll-off information, and the second register stores a second bit of the first roll-off information.

6. The roll-off parameter determining device according to claim 1, wherein the first determining unit comprises:
   a first OR gate, having a first input end coupled to the register unit and a second input end coupled to the analyzing module;
   a second OR gate, having a first input end coupled to the register unit and a second input end coupled to the analyzing module; and
   an AND gate, having a first AND input end, a second AND input end and an AND output end, the first AND input end coupled to a first OR output end of the first OR gate, the second AND input end coupled to a second OR output end of the second OR gate, and the AND gate outputting the first roll-off parameter indicator.

7. The roll-off parameter determining device according to claim 1, wherein the second determining unit comprises:
   a first AND gate, having a first input end coupled to the register unit and a second input end coupled to the analyzing module, outputting a first AND output bit; and a second AND gate, having a first input end coupled to the register unit and a second input end coupled to the analyzing module, outputting a second AND output bit;

wherein, the second roll-off parameter indicator comprises the first AND output bit and the second AND output bit.

8. A roll-off parameter determining method, applied to a receiving terminal of a communication system, the receiving terminal comprising an analyzing module, the analyzing module analyzing a first frame and a second frame to identify first roll-off information in the first frame and second roll-off information in the second frame, the first frame being adjacent to the second frame, the roll-off parameter determining method comprising:

storing the first roll-off information in a register unit;

determining, with a first determining unit, whether one of the first roll-off information and the second roll-off information comprises a first data type according to the first roll-off information received from the register unit and the second roll-off information received from the analyzing module to generate a first roll-off parameter indicator;

determining, with a second determining unit, whether at least one of the first roll-off information and the second roll-off information comprises a second data type according to the first roll-off information received from the register unit and the second roll-off information received from the analyzing module to generate a second roll-off parameter indicator; and looking up a look-up table (LUT) according to the first roll-off parameter indicator and the second roll-off parameter indicator to output a roll-off parameter.

9. The roll-off parameter determining method according to claim 8, wherein each of the first roll-off information and the second roll-off information is formed by two bits.

10. The roll-off parameter determining method according to claim 8, wherein the first data type is "logic 11".

11. The roll-off parameter determining method according to claim 8, wherein the second data type is one of "logic 00", "logic 01" and "logic 10".

12. A receiving terminal, comprising:

an analyzing module, analyzing a first frame and a second frame to identify first roll-off information in the first frame and second roll-off information in the second frame, the first frame being adjacent to the second frame; and a roll-off parameter determining module, outputting a roll-off parameter according to the first roll-off information and the second roll-off information.

13. The receiving terminal according to claim 12, wherein the roll-off parameter determining module comprises:

a register unit, storing the first roll-off information;

a roll-off parameter determining unit, outputting the roll-off parameter according to the first roll-off information received from the register unit and the second roll-off information received from the analyzing module.

14. The receiving terminal according to claim 13, wherein the roll-off parameter determining unit comprises:

a first determining unit, determining whether one of the first roll-off information and the second roll-off information comprises a first data type to generate a first roll-off parameter indicator; and a second determining unit, determining whether at least one of the first roll-off information and the second roll-off information comprises a second data type to generate a second roll-off parameter indicator;

wherein the roll-off parameter determining unit outputs the roll-off parameter according to the first roll-off parameter indicator and the second roll-off parameter indicator.

15. The receiving terminal according to claim 14, wherein the roll-off parameter determining unit further comprises:

a look-up table (LUT) unit, looking up an LUT according to the first roll-off parameter indicator and the second roll-off parameter indicator to output the roll-off parameter.

* * * * *